US006535024B1

(12) United States Patent
Rochard

(10) Patent No.: US 6,535,024 B1
(45) Date of Patent: Mar. 18, 2003

(54) CLOCK SIGNAL FILTERING CIRCUIT

(75) Inventor: Laurent Rochard, Cabries (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/399,233

(22) Filed: Sep. 17, 1999

(30) Foreign Application Priority Data

Sep. 17, 1998 (FR) .......................................... 98 11641

(51) Int. Cl.[7] .......................... G01R 29/02; H03K 9/08
(52) U.S. Cl. ........................................ 327/34; 327/37
(58) Field of Search ........................... 327/34, 217, 37, 327/35, 38, 276, 277, 551

(56) References Cited

U.S. PATENT DOCUMENTS

| 4,525,635 A | * | 6/1985 | Gillberg ..................... 327/161 |
| 4,686,483 A | | 8/1987 | Isshiki et al. ............... 327/552 |
| 5,059,818 A | * | 10/1991 | Witt et al. .................. 327/172 |
| 5,166,631 A | | 11/1992 | Kyrian et al. ............... 327/166 |
| 6,218,870 B1 | * | 4/2001 | Wilson ........................ 327/34 |
| 6,362,674 B1 | * | 3/2002 | Kermani ..................... 327/217 |

FOREIGN PATENT DOCUMENTS

EP           0762649 A2      3/1997         ............ H03K/5/04

\* cited by examiner

*Primary Examiner*—Tuan T. Lam
(74) *Attorney, Agent, or Firm*—Allen, Dyer, Doppelt, Milbrath & Gilchrist, P.A.; Lisa K. Jorgenson

(57) ABSTRACT

A clock signal filtering circuit includes a bistable flip-flop and a controller for controlling state changes of the flip-flop. A first activation circuit activates the controller by edges of non-filtered clock signal pulses when their duration exceeds a first threshold. The first threshold is equal to a half-period corresponding to an upper frequency limit of the clock signal. A second activation circuit activates the controller by edges of filtered clock signal pulses delayed by an amount equal to a half period corresponding to a lower frequency limit of the clock signal. The clock filtering circuit transmits a filtered clock signal at a frequency within a specification interval, and at a duty cycle equal to 0.5 for a variety of different circumstances.

33 Claims, 2 Drawing Sheets

CLOCK SIGNAL FILTERING CIRCUIT

FIELD OF THE INVENTION

The present invention relates to the field of integrated circuits, and, more particularly, to a filter.

BACKGROUND OF THE INVENTION

A clock signal is necessary for the operation of a microcontrolled device. Moreover, the clock signal must meet certain specifications concerning power supply voltage levels and frequency. For instance, the frequency of a clock signal must be in an interval between a minimum frequency and a maximum frequency. For instance, the minimum frequency may be equal to 1 MHz, and the maximum frequency may be equal to 16 MHz.

With a quartz oscillator, for example, different types of faults can be encountered. For instance, the quartz crystal can be broken or disconnected, and its amplifier can be damaged as a result of a failure or ageing, etc. As a result, the frequency of the clock signal can become too low. In some cases, the signal output from the oscillator can suddenly disappear. Conversely, the oscillator can lock onto a harmonic resonance of the quartz crystal which is beyond the intended frequency. The frequency of the clock signal can then be too high.

Consequently, there exists a need for filtering the clock signal generated by the oscillator. Such a filter is interposed between the output of the oscillator and the clock input of the microcontrolled device. A function of the oscillator is to continuously transmit a clock signal whose frequency is within a given range. This given range is known as the specification range. The function of the filter interposed between the oscillator and the clock input of the microcontrolled device must not be confused with that of a bandpass filter. The function of the bandpass filter is to allow the transmission of the harmonics of an analog signal spectrum which falls within a predetermined frequency band, and attenuate the harmonics which fall outside that band.

FIG. 1 is a schematic diagram of a filter circuit FC placed between the output of an oscillator OSC and the clock input CLK of a microcontrolled device $\mu$C. The filter circuit FC receives an non-filtered clock signal, and the clock input CL receives a filtered clock signal.

FIG. 2 shows the waveform of a signal output from the oscillator OSC, i.e., the non-filtered clock signal. This signal is a periodic signal of time period T, with each period having a positive pulse and a negative pulse. A positive pulse is a voltage step to a high level, for example +5V. A negative pulse is a voltage step to a low level, for example −5V or 0V. The value is dependent upon whether the clock signal is two-phase or single-phase. FIG. 2 illustrates a single-phase signal.

Accordingly, the output signal of the oscillator OSC is an alternating sequence of positive and negative pulses. These pulses exhibit at their starting point a rising edge or a falling edge respectively. In general, the positive and negative pulses have the same length or duration. This corresponds to a duty cycle equal to 0.5. Duty cycle is defined as the ratio between the length of the positive pulse and the time period T.

From a functional point of view, a filtering circuit includes a high-frequency filtering circuit which does not pass on positive and negative pulses shorter than a certain duration. This duration is equal to a half-period corresponding to an upper limit frequency $f_H$. This high-frequency filtering circuit further includes a low frequency filtering circuit for generating and sending a backup pulse in the event that no positive or negative pulse is received in a given time limit equal to the half-period corresponding to a lower limit frequency $f_B$.

To ensure that the microcontrolled device operates correctly, the lower frequency $f_B$ of the filter is slightly lower than the minimum frequency, and the upper frequency $f_H$ is slightly higher than the maximum frequency of specification range. This range also includes oscillator output signal frequencies at the limit of the specification range. For the frequency interval cited above, the limits would typically be $f_B$=200 kHz, and $f_H$=20 MHz.

There currently exist clock signal filtering circuits of the above type. These filtering circuits include a circuit for generating and sending, should the need arise, a backup pulse whose length is equal to the half-period corresponding to the upper frequency limit $f_H$. However, these circuits are not fully satisfactory. In particular, the signal sent for a low frequency limitation exhibits a duty cycle far below 0.5. This can be disadvantageous in some applications.

SUMMARY OF THE INVENTION

An object of the present invention is to overcome the above described drawbacks of known filtering circuits.

The invention provides a clock signal filtering circuit having a lower limit frequency and an upper limit frequency. The clock signal filtering circuit includes a bistable flip-flop or latch having an output which delivers a filtered clock signal, and control means for controlling changes of a state of the flip-flop. First activation means activates the control means by edges of the clock signal pulses when their duration is greater than a first threshold equal to a half-period corresponding to the upper frequency limit. Second activation means activates the control means by edges of the filtered clock signal pulses delayed by a time delay equal to a half-period corresponding to the lower frequency limit.

For the first activation means, the changes of the state of the bistable flip-flop occur at substantially regular time intervals if the duty cycle of the non-filtered clock signal is equal to 0.5. For the second activation means, the changes of the state of the bistable flip-flop occur at regular intervals to the extent that the delay introduced is identical for the positive pulses and negative pulses of the filtered clock signal. Consequently, the duty cycle of the filtered clock signal is equal to 0.5 for all circumstances.

BRIEF DESCRIPTION OF THE DRAWINGS

Other characteristics and advantages of the filtering circuit according to the invention shall appear from reading the following description of a preferred embodiment, given purely as an example, with reference to the accompanying drawings in which.

DETAILED DESCRIPTION OF THE PREFERRED EMBODIMENTS

Figure 3:
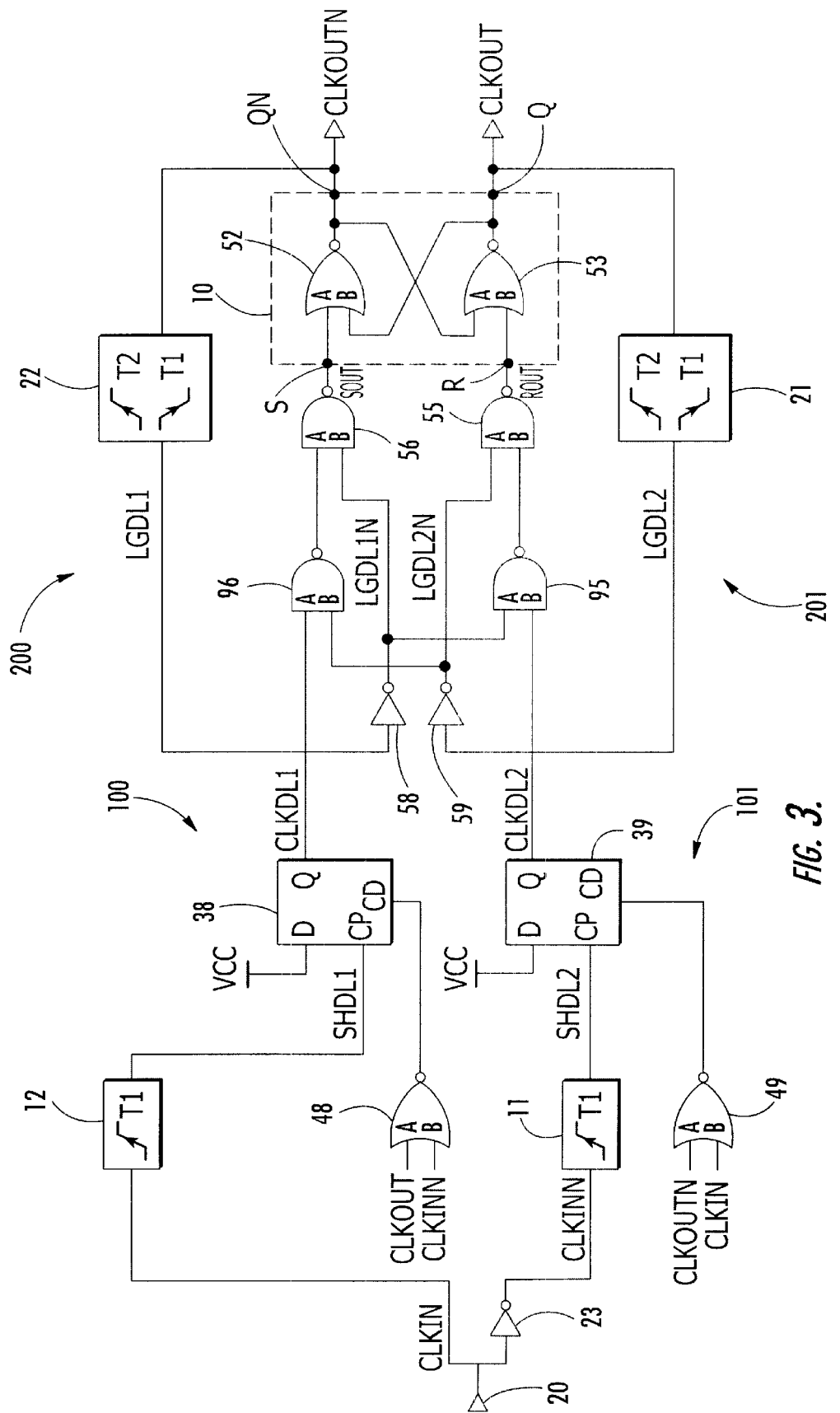
FIG. 3 is a circuit diagram of a filtering circuit, according to the present invention.

Referring to FIG. 3, the filtering circuit comprises a bistable flip-flop or latch 10 known as an RS flip-flop. Such a flip-flop comprises two outputs Q and QN which deliver complementary logic signals, and two inputs S and R. The operation of this flip-flop is asynchronous. To help understand the description that follows, the operation of such a flip-flop shall now be described.

When the logic signal at the S input is a high state and the logic signal at the R input is a low state, the Q output is at a high state and the QN output is at a low state. This forms the first stable state of the flip-flop outputs. Conversely, when the logic signal at the S input is at a low state and the logic signal at the R input is at a high state, the Q output is at a low state and the QN output is at a high state. This forms the second stable state of flip-flop outputs. When the two input signals R and S are at a low state, the flip-flop outputs are maintained in their stable state. This is referred to as the memory or latched state of the flip-flop. When both of these signals are high, the output states are indeterminate. Consequently, this logic combination has no interest and is not used in practice.

The filtering circuit additionally comprises control means for controlling changes of the state of the flip-flop 10. The control means comprises two logic gates having two inputs, such as AND, OR, NAND or NOR logic gates, whose outputs are connected respectively to the S and R inputs of the flip-flop 10. The filtering circuit also comprises first and second activation means for activating the above control means.

The different circuits mentioned above shall first be described in their form according to a particular embodiment, and then functionally with respect to other embodiments. The notation used for a logic signal, an input or an output assigned a binary value 0 corresponds to a low level, while a binary value 1 corresponds to a high level.

The following description of an embodiment of the present invention is based on an RS flip-flop constructed from two looped-back NOR gates 52, 53. The first input A and the second input B of gate 52 and gate 53 respectively form the S and R inputs of the flip-flop. Their respective outputs form the QN and Q outputs of the flip-flop. In addition, the output of gate 53 is connected to the second input B of gate 52, and the output of gate 52 is connected to the first input A of gate 53. The Q and QN outputs of flip-flop 10 respectively deliver signals CLKOUT and CLKOUTN, which are complementary. The filtered clock signal can be one of these two signals, such as signal CLKOUT, for example.

Figure 1:
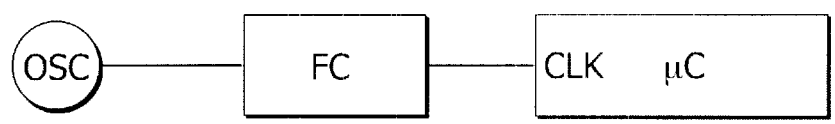
FIG. 1 is a diagram showing the application of a filtering circuit, according to the prior art.
Figure 2:
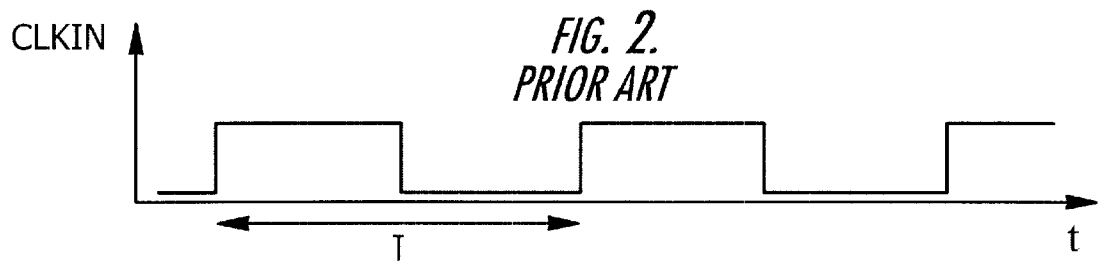
FIG. 2 shows the waveform of a non-filtered clock signal delivered by an oscillator, according to the prior art.

The control means changes the state of the flip-flop 10 and includes NAND gates 56 and 55 having two inputs, designated A and B for each of these two gates. The non-filtered clock signal applied to the input 20 of the filtering circuit is designated CLKIN. This signal is delivered by the oscillator OSC illustrated in FIG. 1.

Starting from the input 20, the first activation means comprises first and second processing branches 100 and 101 respectively. Apart from the presence of an inverter 23 at the input of branch 101, these two branches are identical in structure and symmetrical in their operation. Inverter 23 delivers a signal CLKINN, which is the logical complement of signal CLKIN. As shall be understood later, branch 100 processes the positive pulses of signal CLKIN, and branch 101 processes the negative pulses of that signal. In other words, branch 101 processes the positive pulses of signal CLKINN.

Branch 100 comprises, in cascade, a pulse filtering circuit 12 of a first type, a master-slave flip-flop 38, and a NAND gate 96 having two inputs A and B. The output of pulse filtering circuit 12 is connected to the clock input CP of flip-flop 38 to deliver a signal SHDL1. The signal SHDL1 is obtained from signal CLKIN by delaying the rising edges of that signal by a delay amount T1. The falling edges of CLK1N are not delayed. In other words, the function of the pulse filtering circuit 12 is to pass on only those positive pulses of signal CLKIN whose duration exceeds a threshold. This threshold is equal to T1. An example of the construction of such a circuit shall be described in detail below with reference to FIG. 4. The threshold T1 is equal to the half-period corresponding to upper frequency limit $f_H$ of the filtering circuit.

Input D of flip-flop 38 is connected to a supply terminal which receives a supply voltage VCC equal to +5V. This voltage is referenced with respect to a ground potential. Accordingly, this input is always at a level 1. In addition, output Q of flip-flop 38 is connected to input A of gate 96 to deliver a signal CLKDL1. This signal reproduces the value at input D, i.e., a logic 1, as defined at the moment when input CP passes to level 1. In other words, a logic 1 is produced at the time of the rising edges of signal SHDL1. Signal CLKDL1 returns to 0 at the moment when flip-flop input CD passes to 0. That is, when a low level is applied to that input. The output of a NOR gate 48 having two inputs A and B is connected to input CD of flip-flop 38. This gate 48 receives the signals CLKOUT and CLKINN on its A input and B input respectively. Gate 48 has the function of resetting to zero flip-flop 38.

In addition, the output of gate 96 is connected to input A of gate 56 of the control means. The output of this gate 56 delivers an output signal SOUT to input S of flip-flop 10. Likewise, branch 101 comprises, in cascade, a pulse filtering circuit 11 identical to circuit 12, a master-slave flip-flop 39 and a NAND gate 95 having two inputs A and B. The output of pulse filtering circuit 11 is connected to the clock input CP of gate 39 to deliver a signal SHDL2. Given that circuit 11 is identical to circuit 12, signal SHDL2 is obtained from a signal CLKINN in the same manner as signal SHDL1 is obtained from signal CLKIN.

Input D of flip-flop 39 is also connected to a terminal receiving the voltage VCC so that it is permanently at level 1. Moreover, output Q of flip-flop 39 is connected to input B of gate 95 to deliver thereto a signal CLKDL2 comparable to signal CLKDL1 mentioned above. In addition, the output of gate 95 is connected to input B of gate 55 of the control means. The output of gate 55 delivers a signal ROUT to input R of flip-flop 10.

The second activation means includes first and second branches 200 and 201 respectively. These branches are identical in their structure and symmetrical in their operation. Branch 200 comprises a first pulse filtering circuit of a second type identified by reference numeral 22. The input of circuit 22 is connected to output QN of flip-flop 10. This circuit delivers a signal LGDL1 which is obtained from the signal CLKOUTN delivered by output QN of flip-flop 10. This is done by delaying the rising edges of that signal by a first delay T2, and its falling edges by a second delay which is smaller than delay T2. Delay T2 is equal to the half-period corresponding to the lower limit frequency $f_B$ of the filtering circuit. Preferably, the second delay is at least equal to delay T1 for reasons which shall be apparent from the following discussion.

An example of the construction of such a circuit shall be described in detail below with reference to FIG. 5. The output of circuit 22 is connected to input B of gate 56 via an inverter 58 to deliver thereto a signal LGDL1N, which is the logical complement of signal LGDL1. Likewise, branch 201 comprises a second filtering of the second type identified by reference numeral 21. This circuit is identical to circuit 22. The input of circuit 21 is connected to output Q of flip-flop 10. Its output delivers a signal LGDL2 obtained from signal CLKOUT delivered by flip-flop output Q in the same manner that signal LGDL1 is obtained from signal CLK-OUTN. The output of circuit 21 is connected via an inverter 59 to input A of gate 55 to deliver thereto a signal LGDL2N, which is the logical complement of signal LGDL2.

The operation of the filtering circuit of FIG. 3 will now be described to set out the function of the different circuits whose structures have been described above only as an example of an embodiment of the invention. Three cases regarding the frequency of a non-filtered clock signal CLKIN shall be considered. In a first case, the non-filtered clock signal CLKIN has a frequency lower than the upper limit frequency $f_H$ and higher than the lower limit frequency $f_B$ of the filtering circuit. The lengths of the positive or negative pulses of this signal are thus greater than T1 and less than T2.

Now discussed will be the effect of a positive pulse of signal CLKIN appearing at the input 20 of the filtering circuit, that is, at a transition from CLKIN=0 to CLKIN=1. Initially, it could be shown that CLKIN=0 implies CLKDL1=0, CLKOUT=0, LGDL1=0 and LGDL2=0. The outputs of flip-flop 10 are thus in their second stable state (Q=0; QN=1), and the flip-flop is in its memory or latching state R=0; S=0). The transition to CLK1N=1 implies the transition to SHDL1=1 has a delay T1 since the length of the positive pulse is greater than T1.

This also implies CLKDL1=1 where SOUT=1. In other words, gate 56 is activated by branch 100 of the first activation circuit so that the outputs are set into their first stable state (Q=1; QN=0). Moreover, the transition to CLKOUT=1 implies the reset to zero of flip-flop 38, and hence CLKDL1=0. This results in the transition to SOUT=0. Flip-flop 10 is thus set again to its memory or latching state (SOUT=ROUT=0).

When a negative pulse of the signal CLKIN appears at the input 20 of the filtering circuit, the transition from CLKIN=1 to CLKIN=0 implies the transition of CLKINN=0 to CLKINN=1. Because the length of the negative pulse is greater than T1, this latter transition implies the transition to SHDL2=1 with a delay T1. This results in the transition to CLKDL2 and, subsequently, the transition to ROUT=1. Therefore, this provides the transition to CLKOUT=0.

In other words, gate 55 is activated by branch 101 of the first activation means so that the outputs are set to their second stable state (Q=0; QN=1). In addition, the transition to CLKOUT=0 implies resetting to zero flip-flop 39. This results in the transition to ROUT=0. Flip-flop 10 is thus set again to its memory or latching state (SOUT=ROUT=0).

The operation of branch 101 for a negative pulse of signal CLKIN is identical to that of branch 100 for a positive pulse of that signal. When positive and negative pulses of signal CLKIN alternately appear on input 20 of the filtering circuit, the outputs Q and QN of flip-flop 10 switch alternately from one stable state to the other. Signal CLKOUT then follows signal CLKIN with a delay T1. In particular, this signal has the same duty ratio as signal CLKIN. The positive pulses of signals CLKOUT and CLKOUTN are not sent by circuits 21 and 22 respectively. Consequently, signals LGDL1 and LGDL2 remain permanently in the low state (LGDLI= LGDL2=0). In other words, the second activation means for activating the logic gates 55–56 is not operable. The logic gates 55–56 are automatically inhibited by the operation of the first activation means.

To summarize the first case above, the logic gates 55–56 for controlling the changes of state of the flip-flop 10 are activated by the first activation means 100–101, and the second activation means 200–201 is not operable. The logic gates 55–56 are activated by the positive and negative pulse edges of the non-filtered clock signal CLKIN.

In a second case, the non-filtered clock signal CLKIN has a frequency lower than the lower limit frequency $f_B$ of the filtering circuit. The length of the positive or negative pulses of signal CLKIN is thus greater than T1 and T2. Note that the oscillator OSC does not deliver a clock signal since the absence of a signal is equivalent to a signal of zero frequency, and such pulses are of infinite length.

To illustrate this case, it is assumed that a negative pulse of signal CLKIN has just appeared at input 20 of the circuit. As was shown above for the first case, the transition to CLKIN=0 implies the transition to CLKOUTN=1 has a delay T1. The length of the pulse is by definition greater than T1. Consequently, the outputs of flip-flop 10 are set into their second stable state (Q=0; QN=1). In addition, the transition to CLKOUTN=1 implies the return to CLKDL2=0. Consequently, there occurs the condition ROUT=SOUT=0 so that flip-flop 10 is in the memory or latching state.

Because the state of signal CLKIN remains stable for a period greater than T2, the transition to CLKOUTN=1 implies the transition to LGDL1=1 has a delay T2. This results in the transition to LGDL1N=0, and the transition to SOUT=1. Therefore, this provides the transition to CLKOUTN=0. In other words, gate 56 controls the states of flip-flop 10. Gate 56 is activated by branch 200 of the second activation means after a delay T2 following the transition to CLKOUT=1. More specifically, it is the rising edges of signal CLKOUTN which enables this activation. This is equivalent to stating that it is the falling edges of signal CLKOUT, which enables this transition. In the same manner, it can be shown that gate 55 is activated by branch 201 of the second activation means after a delay T2 following the transition to CLKOUT=1. More specifically, it is the rising edges of signal CLKOUT which enables this activation.

To summarize, in the second case above, the gates 56 and 55 of the control means for changing the state of the flip-flop 10 are activated in alternation by the edges of signal CLKOUT delayed by a delay T2. The clock signal is delayed by the respective branches 200 and 201 of the second activation means. This is true even when an edge of the non-filtered clock signal CLKIN does not appear at the input 20 of the filtering circuit. These activations take place at instances spaced in pairs and having a duration equal to T2. The filtered clock signal CLKOUT therefore has a frequency equal to the lower frequency $f_B$ of the filtering circuit. Moreover, it has a duty cycle equal to 0.5.

On the other hand, there is nothing to prevent the first activation means 100–101 from activating the logic gates 55–56 if an edge of the non-filtered clock signal CLKIN were to appear at the input 20 of the filtering circuit. In particular, it is possible that signal CLKDL1 or signal CLKDL2 passes to 1 before a time delay T1 has elapsed following the previous activation of the logic gates 55–56 by the second activation means 200–201. In such a case, the length of a pulse of the filtered clock signal CLKOUT can be less than T1. The frequency of the filtered clock signal therefore risks being outside the interval lying between $f_B$ and $f_H$.

To prevent this, the filtering circuit also comprises a circuit for inhibiting the first activation means 100–101 for a period at least equal to T1 after the logic gates 55–56 are activated by the second activation means 200–201. These inhibiting circuits include the second type of pulse filtering circuits 22 and 21, inverters 58 and 59, and gates 96 and 95. Operation of these circuits will be discussed below.

After the transition to CLKOUTN=0, signal LGDL1 is held at 1 for a period at least equal to T1 due to the delay introduced by circuit 22 for the falling edges of signal CLKOUTN. Consequently, signal LGDL1N holds input A of gate 95 at 1 for a period at least equal to T1. This has the effect of maintaining signal ROUT at 0 for at least the period T1. The first activation means, and more specifically, branch 101, are thus inhibited in the sense that if a rising edge of signal CLKDL2 were to appear on input B of gate 95, it would not imply a change of state of flip-flop 10.

In the third and last case, a non-filtered clock signal CLKIN has a frequency greater than the upper limit frequency $f_H$ of the filtering circuit. The length of the positive or negative pulses of signal CLKIN is thus less than T1. Accordingly, the positive pulses of signal CLKIN are not passed on by circuit 12, and the positive pulses of signal CLKINN are not passed on by circuit 11. Everything therefore goes on as if clock signal CLKIN were absent. This brings the situation back to the configuration of the second case above. In other words, the control means for controlling the changes of state of flip-flop 10 are activated by the second activation means 200–201. The filtered clock signal at CLKOUT therefore has a frequency equal to the lower limit frequency $f_B$ of the filtering circuit, and has a duty cycle equal to 0.5.

To summarize the above three cases, it can be noted that the clock filtering circuit according to the invention essentially comprises the bistable flip-flop 10 activated by the second activation means 200–201. These circuits are looped back to the S and R inputs to operate as an oscillator oscillating at frequency $f_B$, unless the second activation means 200–201 are naturally inhibited by the first activation means 100–101 when the latter sends the pulses of the non-filtered clock signal CLKIN.

The filtered clock signal CLKOUT therefore has either the lower limit frequency $f_B$ or the frequency of the non-filtered clock signal CLKIN respectively. But it always has a duty cycle equal to 0.5. Moreover, the circuit for inhibiting the first activation means for a period at least equal to T1 prevents the generation of a filtered clock signal having a frequency exceeding frequency $f_H$, which could otherwise occur under certain conditions. This is done after the control means is activated by the second activation means. The frequency of the filtered clock signal CLKOUT is therefore always within the interval between the lower limit frequency $f_B$ and the upper limit frequency $f_H$.

Figure 4:
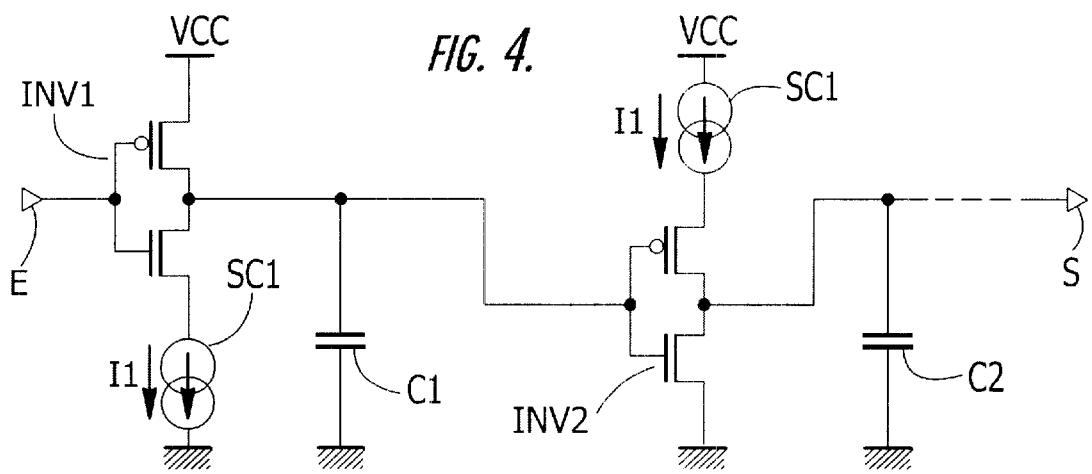
FIG. 4 is a circuit diagram of a first type of pulse filtering circuit used in the filtering circuit of FIG. 3.

FIG. 4 shows a filtering circuit of the first type, such as circuit 12 or circuit 11 of FIG. 3. This filtering circuit comprises n inverters in cascade between an input E and an output S. Only the first and second inverters INV1 and INV2 are shown in the figure. They can be, for example, CMOS inverters which are well known in the art. They comprise a P-channel MOS transistor and an N-channel MOS transistor serially connected between a power supply terminal receiving the voltage VCC and ground. The gates of the transistors are commonly connected and form the inverter input. The drains of the transistors are commonly connected and form the inverter output. A low-value capacitor is connected between the output of each inverter and ground. Thus, a capacitor C1 is charged or discharged by inverter INV1, a capacitor C2 is charged or discharged by inverter INV2, etc. Preferably, all of these capacitors have the same value.

The filtering circuit nevertheless comprises a circuit for controlling the discharge of the capacitor connected at the output of first inverter INV1 with a constant current I1 having a determined value. This control is more generally for each inverter which is odd-numbered in rank. The circuit also controls the charging of the capacitor connected to the output of the second inverter INV2 with the constant current I1. This control is more generally for each inverter which is even-numbered in rank. The aforementioned circuit includes a current source SC1 connected between the source of the N-channel MOS transistor of each inverter of odd number rank and ground. A current source SC1 is connected between the supply terminal and the source of the P-channel MOS transistor of each inverter of even number rank. Current sources SC1 deliver the constant current I1. They comprise a MOS transistor forming part of a device known as a current mirror.

The aforementioned circuit allows the first type pulse filtering circuit to pass on pulses received at input E with a delay T1 for the rising edges, and without any delay for the falling edges. The value of T1 is determined essentially by the value of current I1, but also by the value of the capacitors and by the number n of inverters. The value of the capacitors are chosen to be fairly low so as not to create an appreciable delay for the falling edges. For a clock filtering circuit having an upper frequency limit equal to 20 MHz, a first type pulse filtering with T1=25 ns is chosen.

Figure 5:
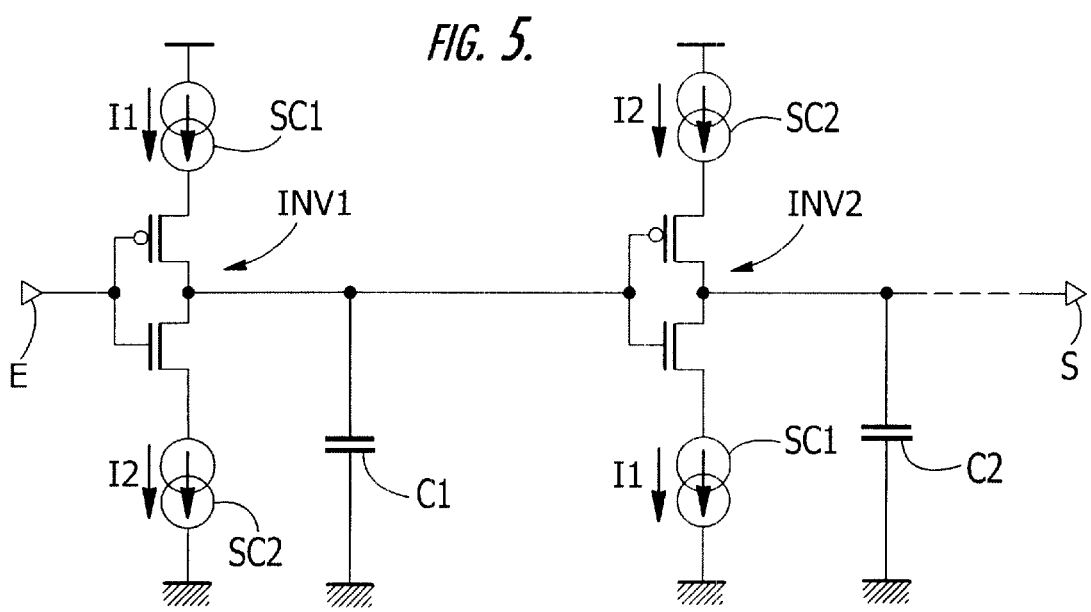
FIG. 5 is a circuit diagram of a second type of pulse filtering circuit used in the filtering circuit of FIG. 3.

FIG. 5 shows the diagram of a pulse filtering second of the second type, such as circuits 22 and 21 of FIG. 3. The circuit is similar to that of FIG. 4, and the same elements as in FIG. 4 are given the same reference numerals. It nevertheless distinguishes therefrom by the following characteristics. A current source SC2 is provided between the source of the N-channel MOS transistor of each inverter odd numbered in rank and ground. A current source SC2 is also between a supply terminal and the source of the P-channel MOS transistor of each inverter even numbered in rank, instead of current sources SC1 in the circuit of FIG. 4. In addition, a current source SC1 is connected between the supply terminal and the source of the P-channel MOS transistors of odd-number rank, and between the source of the N-channel MOS transistors of the even-number rank inverters and ground. The current sources SC1 and SC2 respectively deliver constant currents I1 and I2.

These circuits allow the second-type pulse filtering circuit to pass on pulses appearing at input E with a delay T2 for the rising edges, and a delay T1 for the falling edges. For a clock signal filtering circuit having an upper limit frequency equal to 20 MHz and a lower limit frequency equal to 200 kHz, a second-type pulse filtering circuit with T1=25 ns and T2=2.5 μs is chosen.

Other embodiments can be provided for the pulse filtering circuits. However, the examples described with reference to FIGS. 4 and 5 have the advantage of being simple and easy to adjust. With the circuit of FIG. 4, the value of the threshold T1 depends only on the current I1 and the value of the capacitors C1, C2, etc. Likewise, with the circuit of FIG. 5, the value of the thresholds T1 and T2 depends on he currents I1 and I2 and that of capacitors C1, C2, etc. By using "current mirror" type current sources SC1 (FIG. 4) or SC1 and SC2 (FIG. 5) to generate currents I1 and I2 respectively, it is possible to make the value of these currents independent of variations in the power supply voltage Vce and temperature.

According to another advantage of the invention, the delay T1 with which the filtering of FIG. 4 transmits the non-filtered clock signal pulses is greater than the intrinsic delays introduced by the inverters INV1, INV2, etc. and by the flip-flops 38 and 39 (FIG. 3). The latter is subject to dispersions due to the dispersion in the conduction characteristics of the MOS transistors forming the inverters and the flip-flops. Consequently, the actual delay resulting from the addition of these delays is better controlled since the filtering circuit of FIG. 4 is adequately capable of controlling the delay T1.

Therefore, the pulse filtering circuits of the first and second type conforming respectively to FIGS. 4 and 5 contribute towards making the filtered clock signal frequency less dependent on the variations in the power supply, temperature and dispersions in the conduction characteristics of the MOS transistor used.

Similarly, the embodiment of the clock signal filtering circuit presented above with reference to FIG. 3 is not limiting. In particular, flip-flop 10 can be constructed from NAND gates instead of NOR gates. The logic gates 55–56 can also be gates of a different type, for instance OR or NOR gates. The same applies for gates 96 and 95. In certain cases, it will then be possible to dispense with inverters 58 and 59, and it may also be necessary to add others. Flip-flops 38 and 39, as well as their resetting gates 48 and 49 respectively, can also be replaced by equivalent circuits.

That which is claimed is:

1. A circuit for filtering a clock signal having a lower frequency limit and an upper frequency limit, the circuit comprising:
   a bistable flip-flop having an output for providing a filtered clock signal;
   a controller for controlling state changes of said bistable flip-flop;
   a first activation circuit for activating said controller by edges of non-filtered clock signal pulses when duration of these pulse are greater than a first threshold equal to a half-period corresponding to the upper frequency limit; and
   a second activation circuit for activating said controller by edges of filtered clock signal pulses delayed by an amount equal to a half-period corresponding to the lower frequency limit.

2. A circuit according to claim 1, wherein said first activation circuit comprises first and second pulse filtering circuits of a first type for transmitting only positive or negative pulses respectively of the non-filtered clock signal having pulse lengths greater than the first threshold.

3. A circuit according to claim 1, further comprising a circuit for inhibiting said first activation circuit during a time at least equal to the first threshold after activation of said controller by said second activation circuit.

4. A circuit according to claim 1, wherein said second activation circuit comprises first and second pulse filtering circuits of a second type for transmitting positive pulses of the filtered clock signal having a delay equal to a half-period corresponding to the lower frequency limit.

5. A circuit according to claim 1, wherein said second activation circuit comprises first and second pulse filtering circuits of a second type for transmitting positive pulses of the filtered clock having a delay equal to a half-period corresponding to the lower frequency limit, and transmitting negative pulses of the filtered clock signal having a delay at least equal to the first threshold, and wherein signals output from said first and second pulse filtering circuits of the second type are transmitted as inputs to said first activation circuit.

6. A circuit according to claim 1, wherein said first activation circuit comprises first and second processing branches for processing respectively positive pulses and negative pulses of the non-filtered clock signal.

7. A circuit according to claim 2, wherein each of said pulse filtering circuits of the first type comprises:
   n inverters connected in cascade;
   n capacitors connected between respective outputs of said inverters and ground; and
   a circuit for discharging said capacitors connected to outputs of said inverters of odd-numbered rank, and for charging said capacitors connected to outputs of said inverters of even-numbered rank with a constant current.

8. A circuit according to claim 4, wherein each of said pulse filtering circuits of the second type comprises:
   n inverters connected in cascade;
   n capacitors connected between respective outputs of said inverters and ground; and
   a circuit for discharging said capacitors connected to outputs of said inverters of odd-numbered rank, and for charging said capacitors connected to outputs of said inverters of even-numbered rank with a first constant current; and
   a circuit for charging said capacitors connected to the outputs of inverters of odd-numbered rank, and for discharging said capacitors connected to the outputs of said inverters of even numbered rank with a second constant current.

9. A circuit for filtering a clock signal comprising:
   a bistable flip-flop having an output for providing a filtered clock signal;
   control means for controlling state changes of said bistable flip-flop;
   first activation means for activating said control means by edges of non-filtered clock signal pulses when duration of these pulse are greater than a first threshold;
   second activation means for activating said control means by edges of filtered clock signal pulses delayed by a predetermined amount; and
   a circuit for inhibiting said first activation means during a time at least equal to the first threshold after activation of said control means by said second activation means.

10. A circuit according to claim 9, wherein the first threshold is equal to a half-period corresponding to an upper frequency limit of the clock signal.

11. A circuit according to claim 9, wherein the predetermined amount is equal to a half-period corresponding to a lower frequency limit of the clock signal.

12. A circuit according to claim 9, wherein said first activation means comprises first and second pulse filtering circuits of a first type for transmitting only positive or negative pulses respectively of the non-filtered clock signal having pulse lengths greater than the first threshold.

13. A circuit according to claim 9, wherein said second activation means comprises first and second pulse filtering circuits of a second type for transmitting positive pulses of the filtered clock signal having a delay equal to a half-period corresponding to a lower frequency limit of the clock signal.

14. A circuit according to claim 9, wherein said second activation means comprises first and second pulse filtering circuits of a second type for transmitting positive pulses of the filtered clock having a delay equal to a half-period corresponding to a lower frequency limit of the non-filter clock signal, and transmitting negative pulses of the filtered clock signal having a delay at least equal to the first threshold, and wherein signals output from said first and second pulse filtering circuits of the second type are transmitted as inputs to said first activation means.

15. A circuit according to claim 9, wherein said first activation means comprises first and second processing branches for processing respectively positive pulses and negative pulses of the non-filtered clock signal.

16. A circuit according to claim 12, wherein each of said pulse filtering circuits of the first type comprises:
   n inverters connected in cascade;
   n capacitors connected between respective outputs of said inverters and ground; and
   a circuit for discharging said capacitors connected to outputs of said inverters of odd-numbered rank, and for charging said capacitors connected to outputs of said inverters of even-numbered rank with a constant current.

17. A circuit according to claim 13, wherein each of said pulse filtering circuits of the second type comprises:
   n inverters connected in cascade;
   n capacitors connected between respective outputs of said inverters and ground; and
   a circuit for discharging said capacitors connected to outputs of said inverters of odd-numbered rank, and for charging said capacitors connected to outputs of said inverters of even-numbered rank with a first constant current; and
   a circuit for charging said capacitors connected to the outputs of inverters of odd-numbered rank, and for discharging said capacitors connected to the outputs of said inverters of even numbered rank with a second constant current.

18. A circuit for filtering a clock signal comprising:
   a bistable flip-flop having an output for providing a filtered clock signal;
   a controller for controlling state changes of said bistable flip-flop;
   first and second pulse filtering circuits of a first type for activating said controller by edges of non-filtered clock signal pulses when duration of these pulse are greater than a first threshold, said first and second pulse filtering circuits of the first type transmitting only positive or negative pulses respectively of the non-filtered clock signal having pulse lengths greater than the first threshold; and
   first and second pulse filtering circuits of a second type for activating said controller by edges of filtered clock signal pulses delayed by a predetermined amount, said first and second pulse filtering circuits of the second type transmitting positive pulses of the filtered clock having a delay equal to the predetermined amount, and transmitting negative pulses of the filtered clock signal having a delay at least equal to the first threshold.

19. A circuit according to claim 18, wherein the first threshold is equal to a half-period corresponding to an upper frequency limit of the clock signal.

20. A circuit according to claim 18, wherein the predetermined amount is equal to a half-period corresponding to a lower frequency limit of the clock signal.

21. A circuit according to claim 18, further comprising a circuit for inhibiting said first and second pulse filtering circuits of a first type during a time at least equal to the first threshold after activation of said controller by said first and second pulse filtering circuits of a second type.

22. A circuit according to claim 18, wherein the signals output from said first and second pulse filtering circuits of the second type are transmitted as inputs to said first and second pulse filtering circuits of the first type.

23. A circuit according to claim 18, wherein said first and second pulse filtering circuits of the first type comprises first and second processing branches for processing respectively positive pulses and negative pulses of the non-filtered clock signal.

24. A circuit according to claim 18, wherein each of said first and second pulse filtering circuits of the first type comprises:
   n inverters connected in cascade;
   n capacitors connected between respective outputs of said inverters and ground; and
   a circuit for discharging said capacitors connected to outputs of said inverters of odd-numbered rank, and for charging said capacitors connected to outputs of said inverters of even-numbered rank with a constant current.

25. A circuit according to claim 18, wherein each of said first and second pulse filtering circuits of the second type comprises:
   n inverters connected in cascade;
   n capacitors connected between respective outputs of said inverters and ground; and
   a circuit for discharging said capacitors connected to outputs of said inverters of odd-numbered rank, and for charging said capacitors connected to outputs of said inverters of even-numbered rank with a first constant current; and
   a circuit for charging said capacitors connected to the outputs of inverters of odd-numbered rank, and for discharging said capacitors connected to the outputs of said inverters of even numbered rank with a second constant current.

26. A method for filtering a clock signal, the method comprising:
   detecting edges of non-filtered clock signal pulses when duration of these pulse are greater than a first threshold, the first threshold being equal to a half-period corresponding to an upper frequency limit of the clock signal;
   detecting edges of filtered clock signal pulses delayed by a predetermined amount; and
   controlling state changes of a bistable flip-flop having an output for providing a filtered clock signal based upon the detected edges of the non-filtered and filtered clock signal pulses.

27. A method according to claim 26, wherein the predetermined amount is equal to a half-period corresponding to a lower frequency limit of the clock signal.

28. A method according to claim 26, wherein detecting edges of the non-filtered clock signal pulses comprises filtering the non-filtered clock signal for transmitting only positive or negative pulses respectively of the non-filtered clock signal having pulse lengths greater than the first threshold.

29. A method according to claim 26, further comprising inhibiting detection of the edges of the non-filtered clock signal pulses during a time at least equal to the first threshold after controlling state changes of the bistable flip-flop responsive to detection of the edges of the filtered clock signal pulses.

30. A method according to claim 26, wherein detecting the edges of the filtered clock signal pulses comprises filtering the filtered clock signal for transmitting positive pulses of the filtered clock signal having a delay equal to a half-period corresponding to a lower frequency limit of the clock signal.

31. A method according to claim 26, wherein detecting the edges of the filtered clock signal pulses comprises filtering the filtered clock signal for transmitting positive pulses of the filtered clock signal having a delay equal to a half-period corresponding to a lower frequency limit of the clock signal, and for transmitting negative pulses of the filtered clock signal having a delay at least equal to the first threshold.

32. A method according to claim 28, wherein filtering the non-filtered clock signal pulses for transmitting only positive or negative pulses comprises:

discharging capacitors connected to outputs of inverters of odd-numbered rank; and charging capacitors connected to outputs of the inverters of even-numbered rank with a constant current.

33. A method according to claim 31, wherein filtering the filtered clock signal pulses for transmitting only positive or negative pulses comprises:

discharging capacitors connected to outputs of inverters of odd-numbered rank;

charging capacitors connected to outputs of the inverters of even-numbered rank with a constant current; and charging capacitors connected to outputs of the inverters of even-numbered rank with a second constant current.

* * * * *